United States Patent [19]
Broderick

[11] Patent Number: 5,170,500
[45] Date of Patent: Dec. 8, 1992

[54] INTERMEDIATE FREQUENCY CIRCUIT FOR CELLULAR TELEPHONE TRANSCEIVER USING SURFACE ACOUSTIC WAVE FILTER

[75] Inventor: Sean M. Broderick, Scottsdale, Ariz.
[73] Assignee: Goldstar Products Co., Limited, Tempe, Ariz.
[21] Appl. No.: 562,262
[22] Filed: Aug. 3, 1990
[51] Int. Cl.⁵ .......................... H04B 1/26; H03H 9/00
[52] U.S. Cl. ........................... 455/315; 455/89; 455/339; 333/194
[58] Field of Search .......... 455/89, 207, 208, 314–317, 455/339, 307; 333/193–196

[56] References Cited

U.S. PATENT DOCUMENTS

| | | | |
|---|---|---|---|
| 3,872,410 | 3/1975 | Zucker | 333/72 |
| 4,060,833 | 11/1977 | Onyshkevych | 358/188 |
| 4,162,451 | 7/1979 | Ash . | |
| 4,162,452 | 7/1979 | Ash . | |
| 4,245,200 | 1/1981 | Takahashi et al. | 333/193 |
| 4,253,119 | 2/1981 | Jones | 358/188 |
| 4,316,220 | 2/1982 | Muterspaugh et al. | 358/196 |
| 4,410,864 | 10/1983 | Mutershaugh et al. | 333/32 |
| 4,484,222 | 11/1984 | Banach | 358/196 |
| 4,564,858 | 1/1986 | Resch | 358/21 |
| 4,602,287 | 7/1986 | Fockens | 358/197 |
| 4,602,288 | 7/1986 | Everett | 358/197 |
| 4,654,885 | 3/1987 | Meszko et al. | 455/219 |
| 4,726,072 | 2/1988 | Yamashita et al. | 455/315 |
| 4,814,874 | 3/1989 | Adachi | 358/140 |
| 4,885,801 | 12/1989 | Hansen | 455/307 |
| 5,010,584 | 4/1991 | Seki | 455/314 |
| 5,034,994 | 7/1991 | Muterspaugh et al. | 455/307 |

OTHER PUBLICATIONS

"Applications of Surface Acoustic and Shallow Bulk Acoustic Wave Devices", by Colin K. Campbell, Proceedings of the IEEE, vol. 77, No. 10, Oct. 1989, pp. 1453–1471.

Primary Examiner—Curtis Kuntz
Attorney, Agent, or Firm—Cahill, Sutton & Thomas

[57] ABSTRACT

An IF circuit suitable for use in a cellular telephone transceiver includes a first mixer circuit receiving an rf signal and a first local oscillator signal and producing a first signal. The first signal is amplified by a first amplifier to produce an amplified second signal. A first impedance matching circuit receives the second signal and matches it to a first impedance. A double-mode resonator SAW bandpass filter with a bandwidth of approximately 30 kilohertz and a noise figure less than 5 dbm produces a filtered third signal in response to the second signal. A second impedance matching circuit is connected to receive the third signal after it is filtered by the double-mode resonator SAW bandpass filter, and impedance matches it to a second impedance. A second amplifier receives and amplifies the third signal. A second mixer circuit receives the fourth signal and a second local oscillator signal, and produces an IF signal.

9 Claims, 2 Drawing Sheets

INTERMEDIATE FREQUENCY CIRCUIT FOR CELLULAR TELEPHONE TRANSCEIVER USING SURFACE ACOUSTIC WAVE FILTER

BACKGROUND OF THE INVENTION

The invention relates to cellular telephone systems and particularly to intermediate frequency (IF) circuits utilizing a laterally-coupled double-mode resonator surface acoustic wave (SAW) filter to perform the function of received signal channel selection.

IF circuits of various kinds are well-known in radio receiver technology. They generate a difference frequency, called an intermediate frequency, or IF frequency, which actually is a "difference frequency" between a modulated rf signal received via an antenna and a "local frequency" generated by a so-called "local oscillator". The generation of the IF frequency signal eliminates the rf carrier of the modulated rf signal, and the IF frequency signal contains all of the modulation information representing information which is to be decoded to produce audio frequency signals. Most prior IF circuits use monolithic crystal filters to perform the function of intermediate frequency channel selection.

A few prior IF circuits used for television receivers utilize SAW devices as filters. Although SAW filters have been used in IF circuits for television receivers, television receivers have relatively large input signal levels and high signal-to-noise ratios. Television receivers also have wide bandwidths and channel separations, of the order of one megahertz or greater. Furthermore, television receivers do not share the same antenna with a transmitter. All of these factors make it practical to use the prior wide bandwidth, high insertion loss SAW filters in television receivers.

However, SAW filters ordinarily would not be considered to be suitable for use in a cellular telephone transceiver because present regulations allow only 30 kilohertz separation between adjacent bands in a cellular telephone system, and because the cellular telephone receiver must function properly for signal levels in the $-116$ dbm to 0 dbm level, and must share an antenna with a transmitter capable of producing up to three watts of output power. Prior SAW filters generally produce so much insertion loss that use of such a filter would result in the necessity of re-amplifying the signal, which inherently would unacceptably increase the amount of noise in the signal and reduce the already low signal-to-noise ratio.

Thus, despite extensive development of circuit design technology in the fields of IF circuits, bandpass filter circuitry, and SAW filters, there still is considerable room for improvements that can allow use of more effective, lower cost components in receiver circuits, especially ones for use in narrow band, low level signal applications such as cellular telephone transceivers.

The closest known prior art utilizes SAW filters in television IF applications, in which high loss, larger bandwidth SAW devices are used for filtering. Another known type of SAW filter is referred to as a "double mode" resonator. This type of SAW filter traditionally has been used in oscillators. Double mode SAW resonators result in much lower insertion loss than traditional SAW filters, and also have much narrower bandwidth. Their circuit "Q" approaches 15,000, 150% greater than conventional SAW filter design technologies.

The bandwidth of SAW filters which have been used in prior IF circuits of television receivers typically is approximately one megahertz. The EIA (Electronics Industry of America) cellular telephone standard IS19B has established specifications for adjacent channels and alternate channels in cellular telephone systems, wherein adjacent channel center frequencies are separated by 30 kilohertz, and alternate channel center frequencies are separated by 60 kilohertz, much narrower than the bandwidth of SAW filters in prior IF circuits of television receivers.

In contrast, in the television receiver environment, the transmitters produce signals of thousands of watts, with ranges of hundreds of miles. This environment presents far different constraints on the design of receiver circuitry than is the case for the design of receivers for the cellular telephones in which the receivers are included in the same circuit with transmitters. Cellular telephone base stations typically transmit signals of only 15 watts, with ranges of 10 to 15 miles. The cellular television receiver is incorporated in a transceiver, the transmitter of which transmits up to three watts on the same antenna on which the incoming signals with levels as low as $-116$ dbm are being received, so if a SAW filter were to be used in a cellular telephone transceiver, the SAW filter would have to also alternate the three watt signals being transmitted on the same antenna by the transmitter section of the transceiver as well as provide proper selectivity, without substantial insertion loss, between 30 kilohertz channels. The maximum power received by cellular telephone transceivers is typically $-30$ dBm (maximum), which is a very low power level for a receiver section of a transmitter that is capable of producing 34.77 dBm (three watts). The above EIA cellular telephone specification requires a SINAD of 12 db for a $-116$ dBm input signal with 1 kilohertz modulating frequency having a deviation of $\pm 8$ kilohertz for cellular telephone transceivers. (Note that:

$$SINAD = \frac{SIGNAL + NOISE + DISTORTION}{NOISE + DISTORTION})$$

Until very recently, there were no available double mode SAW resonators capable of operating with sufficiently low insertion loss to be considered for utilization in an FM receiver designed for receiving signal levels as low as would be required for a cellular telephone system.

The state of the art for SAW filters is set forth in "Surface Acoustic Waves for Signal Processing" by Feldmann and Henaff, published by Artech House, Boston and London, 1986, English translation 1989. A double mode resonator, shown in FIG. 4 hereof, consists of two interdigital transducers (IDT's) 48 and 51 both located in a resonant cavity. The electric input signal is transformed into a surface acoustic wave by the IDT 48. The acoustic wave propagates through the cavity along reflector pattern 49 and reflector pattern 50 and is detected by the second IDT 51. The IDT spacings, the cavity size and other factors interplay to produce the insertion loss. From a "black box" viewpoint, a dual mode SAW resonator functions as a dual port filter having lower insertion loss and much narrower bandwidth than previously available in any type of prior SAW filter.

SUMMARY OF THE INVENTION

Accordingly, it is an object of the invention to provide a low cost transceiver for use in cellular telephone systems.

It is another object of the invention to provide a low cost IF circuit suitable for use in cellular telephone transceivers.

It is another object of the invention to provide a low cost filter with sufficiently low insertion loss and sufficiently narrow bandwidth to be practical for use in a receiver of a cellular telephone transceiver.

It is another object of the invention to provide a low cost IF circuit suitable for use in cellular telephone receivers wherein no tuning or adjustment of the receiver front end circuitry is required during manufacture of the IF circuit.

Briefly described, and in accordance with one embodiment thereof, the invention provides an IF circuit suitable for use in a cellular telephone transceiver, including a double mode surface acoustic wave filter in an IF circuit. The IF circuit includes a first mixer circuit receiving an rf signal from a low noise input amplifier and a first local oscillator signal from a first local oscillator circuit and producing in response thereto a first signal. A first amplifier receives the first signal and produces an amplified second signal. A first impedance matching circuit receives the second signal and "impedance matches" it to a first input impedance. A dual resonator SAW bandpass filter with a bandwidth of approximately 30 kilohertz and a noise figure of less than 5 db has an input connected to receive the second signal, and produces a filtered third signal. A second impedance matching circuit is connected to receive the third signal after it is filtered by the dual-mode resonator SAW bandpass filter, and "impedance matches" it to a second input impedance. A second amplifier receives and amplifies the third signal after it has been impedance matched. A second mixer circuit receives the fourth signal and a second local oscillator signal, and produces an IF signal in response to the fourth signal and the second local oscillator signal. A first IF filter is connected to receive and filter the fourth signal. A third amplifier amplifies the IF signal to produce an amplified IF signal. A quadrature detector circuit is connected to produce an audio frequency output signal in response to the amplified IF signal. In the described embodiment of the invention, the third amplifier includes a limiter amplifier circuit that performs the function of limiting the incoming signals level. An audio buffer circuit receives the audio frequency output signal produced by the detector circuit to produce an amplified audio output signal. A second IF filter couples an output of a first stage of the third amplifier to an input of the limiter amplifier.

DETAILED DESCRIPTION OF THE PREFERRED EMBODIMENTS

Figure 1:
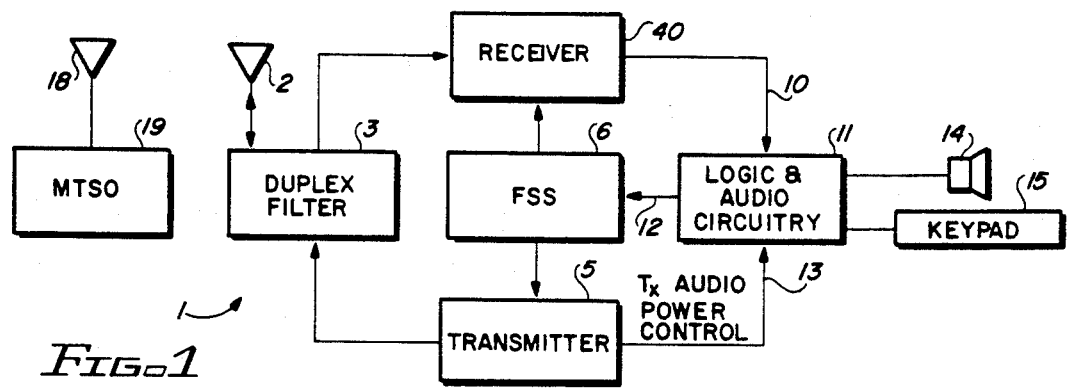
FIG. 1 is a block diagram of a typical cellular telephone system.

Referring to FIG. 1, a typical cellular telephone system 1 includes a base station 19, referred to as an MTSO (Mobile Telephone Switching Office) which performs the function of coupling a "land side" telephone to a "cell site" facility that includes a transmitter, a receiver, filtering circuitry, and control equipment. MTSO 19 is connected to an antenna 18 that typically is located at the base station site. A cellular telephone transceiver includes an antenna 2 connected to a duplex filter 3 to produce 45 megahertz separation to isolate transmitter signals of transmitter 5 from being received by receiver 4. Duplex filter 3 is connected by rf cable 16 to receiver 4, which is controlled by a frequency synthesizer (FSS) unit 6. Duplex filter 3 is connected by rf cable 17 to transmitter 5, which also is controlled by FSS 6.

Frequency synthesizers of MTSO 19 set the channel spacings at 45 megahertz, as there are 832 channels in the cellular telephone systems, each spaced 30 kilohertz from an adjacent one. It should be emphasized that the transceiver of FIG. 1 is a full duplex telephone transceiver that receives signals as low as −116 dbm and transmits output signals of 34.77 dBm. Extensive filtering between 832 channels obviously is necessary to avoid interference between adjacent channels.

The logic circuitry in block 11 is connected by conductors 10 to receiver 4 and by conductors 13 to transmitter 5. A keypad 15 is connected to logic circuit 11, and an audio transducer such as a speaker or earphone 14 also is connected to logic/audio circuit 11.

The dual mode SAW resonator used in the IF circuit permits these very low level input signals to be received without the need to add additional amplification that inherently amplifies noise in the input stage of the receiver, reducing the signal-to-noise ratio.

Figure 2:
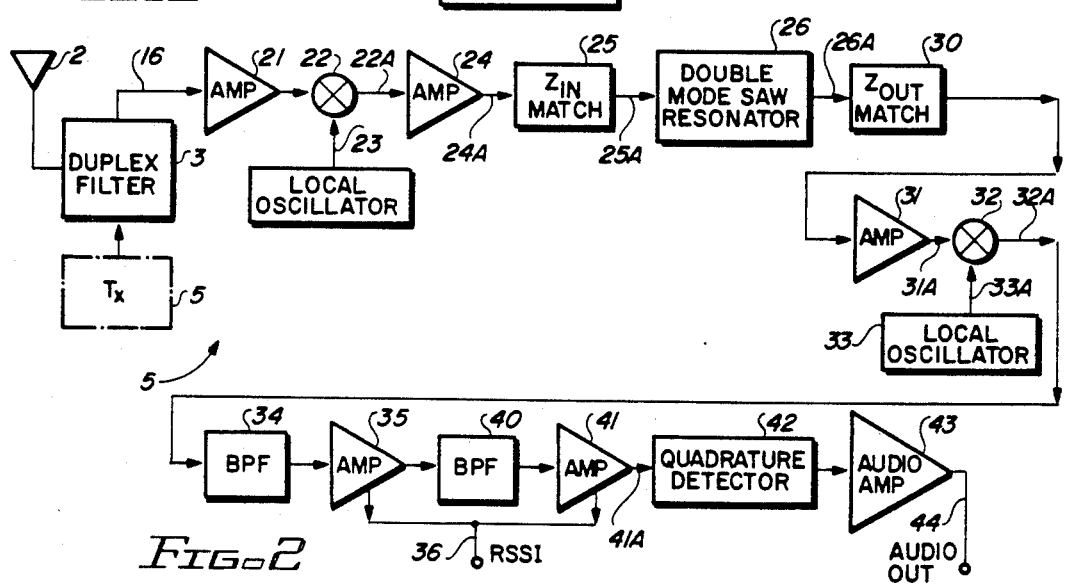
FIG. 2 is a more detailed block diagram of the receiver included in the diagram of FIG. 1.
Figure 4:
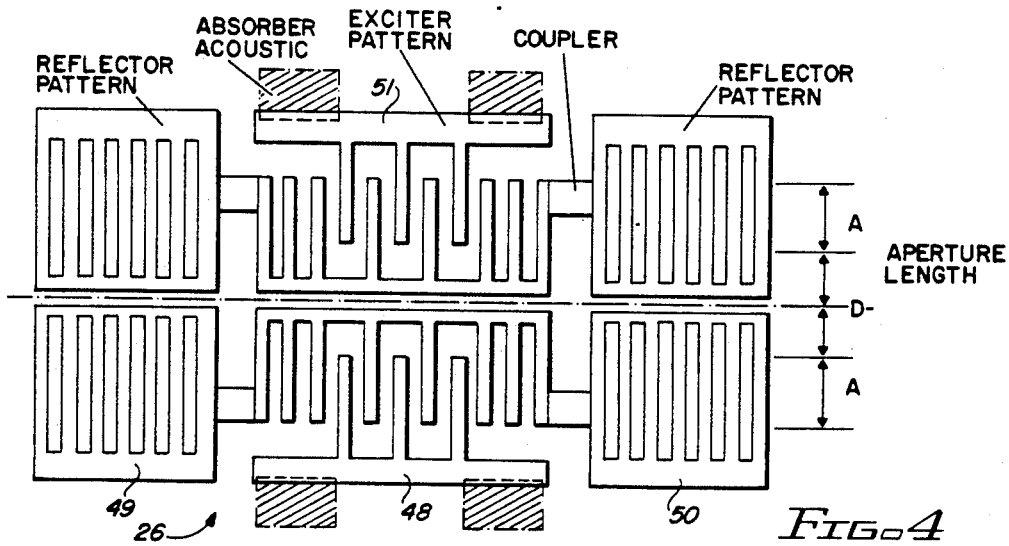
FIG. 4 is a diagram useful in describing a dual mode SAW resonator.

FIG. 2 shows the details of receiver 5 of FIG. 1. In FIG. 2, a "front end" low noise amplifier 21 receives a modulated 869 to 894 megahertz rf signal on conductor 16 from duplex filter 3, amplifies it, and applies the resulting output signal to a first IF mixer circuit 22. Low noise amplifier 21 should have a noise figure of less than approximately 2 db. If mixer circuit 22 receives a local oscillator injection signal on conductor 23, and produces an output signal that is applied to the input of first IF amplifier 24. The output of amplifier 24 is applied to the input of a broad band impedance matching circuit. The output 25A of impedance matching circuit 25A is connected to the input of a dual mode SAW resonator having a center frequency of 83.16 megahertz, as indicated by numeral 26. The output of dual mode SAW resonator 26 is applied to an impedance matching circuit 30, the output of which is applied to an input of a second IF amplifier 31.

The output of amplifier 31 is connected to the input of a second IF mixer 32, which is driven by a 82.705 local oscillator circuit 33. The output of IF mixer 32 is filtered by 455 kilohertz ladder filter circuit 34. IF mixer 32 produces a difference signal of 455 kilohertz to enable the quadrature detector 42 to detect audio signals. The output of ladder filter 34 is connected to the input of a third IF amplifier 35, the output of which is applied to a 455 kilohertz ladder filter circuit 40. The output of circuit 40 is connected to a limiter amplifier 41, the output of which is fed to a quadrature detector circuit 42. The output of quadrature detector circuit 42 is applied to the input of an audio buffer amplifier 43, the output of which produces the desired audio output signal 44.

If the gain of amplifier 21 is increased, this would have the disadvantage that a corresponding amount of gain would also be applied to the signal from the transmitter 5. This would be likely to cause amplifier 21 to operate in its nonlinear region.

Because of this, it is necessary that a very low insertion loss filter be provided in the front end of an IF circuit in a cellular telephone receiver.

The receiver circuit 5 is a dual conversion receiver, which means that it converts from 869 to 894 megahertz through a first IF circuit down to 83.16 megahertz, through the IF filtering, and then through a second IF mixer with a local oscillator frequency of 82.705 megahertz down to 455 kilohertz.

In operation, the signal received from antenna 2 passes through duplex filter 3 and filters the RF spectrum of the receiver between 869.04 megahertz and 894.97 megahertz. Low noise rf amplifier 21 is a broad band (20 megahertz), low noise (noise figure of less than 2 db), relatively high gain (16 db) amplifier. This output of amplifier 21 then is injected into mixer 22, which can be either a passive double balanced diode mixer or an active circuit mixer. The local oscillator frequency on conductor 23 is produced by the frequency synthesizer to mix the difference 869.04 to 894.97 megahertz signal and an 83.16 megahertz signal below that (i.e., 785.84 to 810.84 megahertz) thereby producing the result of 83.16 megahertz. The maximum local oscillator frequency is 894 megahertz minus 83.16 megahertz. The frequency synthesizer maintains the proper local oscillator signal to produce 83.16 megahertz.

The output of mixer 22 is amplified by the first IF amplifier 24, which is a low noise (noise figure of less than 2 db) high gain amplifier (with gain of approximately 16 db). The output of first IF amplifier 24 is applied to impedance matching circuit 25, which "impedance matches" the input to the 50 ohm input of SAW filter 26.

It is important that the good impedance match be provided to the output of the IF amplifier by the SAW input not only at the SAW center frequency of 83.16 megahertz but also at nearby frequencies, because SAW devices are likely to be mismatched. Impedance mismatching of signals outside of its bandwidth seriously degrades the performance of a dual mode SAW resonator. I have found that a good impedance match of SAW narrow band filter 26 to the output of the IF amplifier results in excellent performance, but if there is any out of band mismatching, then poor performance results. Therefore, circuit 25 is "broad band impedance matched" to the output of IF amplifier 24 and to the input of SAW filter 26, up to 2 gigahertz.

SAW filter 26 has a low noise figure that is always less than 5 db, and typically is as low as 3 db. This is very important in maintaining a low noise figure for the front end of receiver 5.

The output of SAW filter 26 is "impedance matched" to 1200 ohms (the input impedance of amplifier 31) and is input to a second IF amplifier 31, the output of which is applied to the input of a second IF mixer 32. IF mixer 32 receives a fixed 82.705 megahertz crystal oscillator 33 to down-convert the signal produced by second IF amplifier 31 to 455 kilohertz, i.e., to produce a difference frequency of 455 kilohertz (83.16 megahertz minus 82.705 megahertz). Filter 34 is a ceramic narrow band 455 kilohertz filter, the output of which is applied to the input of a third high gain IF amplifier 35. (Third IF amplifier 35 and limiter amplifier 41 together provide roughly 100 db of gain.) Another 455 kilohertz ladder filter 40 applies the output of third IF amplifier 35 to the input of limiter amplifier 41. An RSSI (Receiver Signal Strength Indicator) is derived from the limiter amplifier and the third IF amplifier 35 and sent to a microprocessor. The microprocessor monitors the RSSI and uses it to determine which channel is strongest in signal strength. This indicates to the transceiver how strong the received signal is on a particular channel.

Quadrature detector 42 detects audio signal components from the output of limiter amplifier 41, and in response to that audio amplifier 43 produces the desired audio output signal 44.

Figure 3:
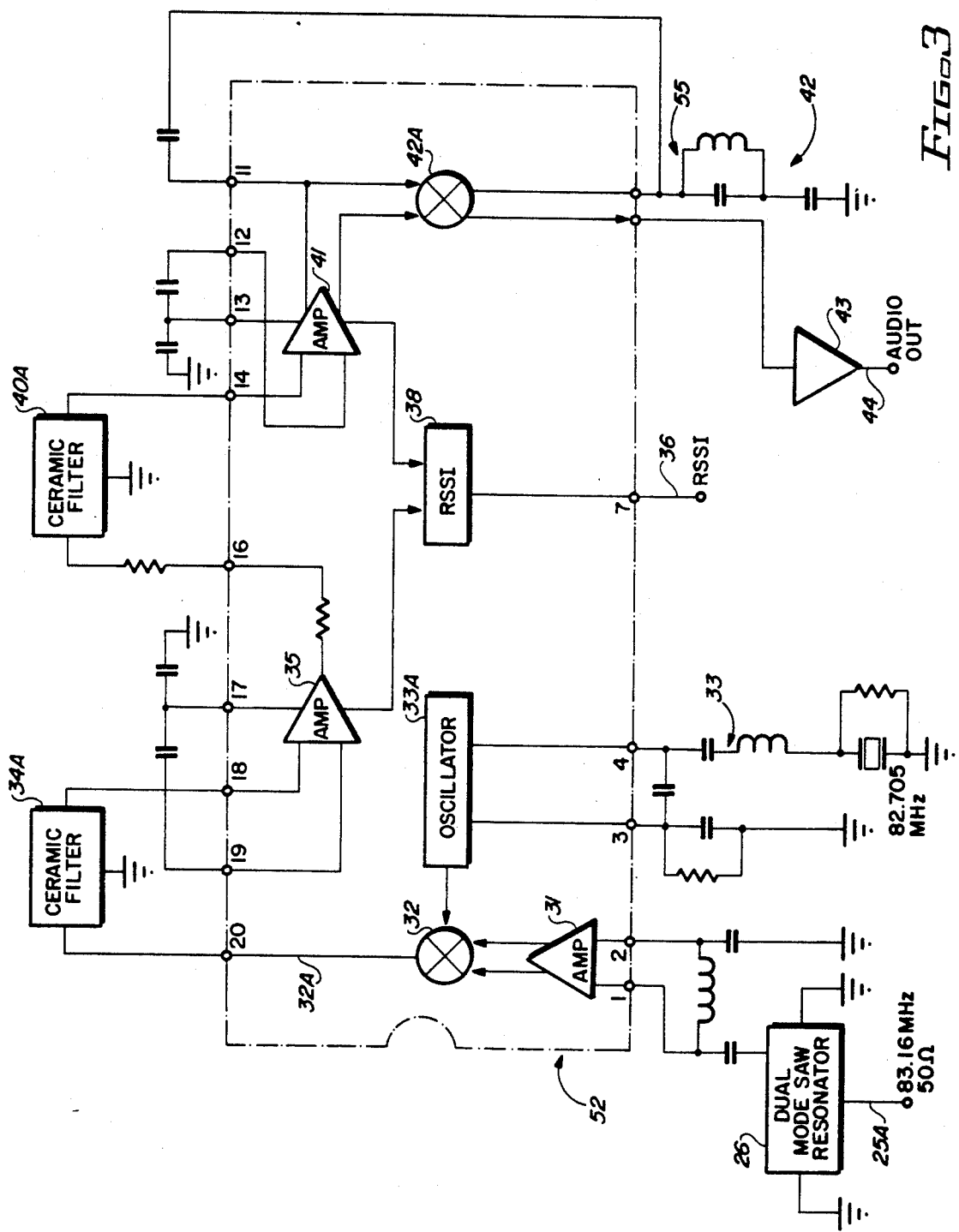
FIG. 3 is a more detailed diagram of the receiver circuit in FIG. 1.

FIG. 3 shows more details of a practical implementation of part of the circuit of FIG. 2. The same reference numerals are used as in FIG. 2 to indicate corresponding circuit elements.

In FIG. 3, the output of impedance matching circuit 25 is fed by conductor 25A to the input of SAW bandpass filter 26, which can be a SWS831, available from TOKO. Its output passes through impedance matching circuitry including three picofarad capacitor 30A, 0.74 microhenry inductor 30B, and 0.001 microfarad capacitor 30C connected as shown to lead number 1 and lead number 2 of a Signetics NE/SA605 integrated circuit IF block designated by numeral 52. Integrated circuit 52 includes the second intermediate amplifier 31 having its inputs connected to the outputs of impedance matching circuit 30, and supplies differential inputs into the second IF mixer 32. Circuitry 33A in integrated circuit 52 includes an oscillator output transistor of local oscillator 33 circuit, with external components and an 82.705 megahertz crystal connected as shown. An external ceramic filter 34A is utilized to implement the 455 hertz ladder filter circuit 34 of FIG. 2.

The output of ceramic filter 34A is applied to one input of third IF amplifier circuit 35, which also is included in integrated circuit 52. The RSSI (Receiver Signal Strength Indicator) output is connected to circuit 38, which develops the RSSI output signal on lead number 7 of integrated circuit 52. The RSSI (Receiver Signal Strength Indicator) output signal is derived by circuit 38 from the outputs of both the third IF amplifier 35 and the limiter amplifier 41. The main output of third IF amplifier 35 is connected to another external ceramic filter 40A used as the 455 hertz ladder filter circuit 40 of FIG. 2. The output of filter circuit 40A is fed into one input of limiter amplifier 41. The outputs of limiter amplifier 41 are coupled to a portion 42A of quadrature detector circuit 42 contained in integrated circuit 52. Quadrature detector circuit 42A is connected to an external coil circuit 55 and produces an audio output signal that is applied to an external audio buffer amplifier 43.

The present invention distinguishes over the prior art by providing the combination of a double-mode SAW filter in IF circuitry of a mobile cellular telephone receiver. This is in contrast to the disclosure of U.S. Pat. No. 4,654,885 which discloses a mobile radio receiver using a high insertion loss SAW filter 40 to provide an appropriate time delay to enable an extender to blank the received signal. This prevents noise from entering the IF section. The present invention does not use the time delay associated with a SAW filter to blank the received audio signal. (SAW filters have a triple travel time delay which the above reference utilizes for blanking purposes.) Since the SAW filter characteristics and center frequency are established by a precision photo-lithography process, the SAW device ensures that no tuning or adjustment will be required in the "front end" of the mobile telephone receiver in a production manufacturing process. The disclosed SAW filter 40 of U.S. Pat. No. 4,654,885 is a traditional SAW filter, not a resonator, and the described mobile telephone system is not intended for use in a cellular telephone system, and does not meet the low signal level requirements, high signal-to-noise ratio requirements, and low noise requirements of a mobile cellular telephone receiver. The circuitry of U.S. Pat. No. 4,654,885 clearly is intended primarily for a high bandwidth filter much broader than the bandwidth required for mobile cellular telephone receivers. U.S. Pat. No. 3,872,410 discloses a wide band, high insertion loss surface wave filter for a IF stage of a television receiver. It could not be used in the front end of a cellular telephone receiver.

Prior SAW filter architectures would not be applicable to cellular telephone applications due to the high circuit "Q" required for 30 kilohertz channel separation in an 800 megahertz cellular system. A laterally-coupled double-mode resonator makes it possible to achieve a circuit "Q" of up to 15,000 (150% greater than conventional SAW filter design technologies). This allows for channel selection to be performed by a single SAW device.

Since SAW filter characteristics and center frequency are established by a precision photo-lithography process, use of SAW device 26 also insures that no tuning or adjustment will be required on the receiver front end in a production manufacturing process.

While the invention has been described with reference to several particular embodiments thereof, those skilled in the art will be able to make the various modifications to the described embodiments of the invention without departing from the true spirit and scope of the invention. It is intended that all combinations of elements and steps which perform substantially the same function in substantially the same way to achieve the same result are within the scope of the invention.

What is claimed is:

1. An IF circuit for use in a cellular telephone receiver, comprising in combination:
    (a) a first mixer circuit receiving an rf signal from a low noise input amplifier and a first local oscillator signal from a first local oscillator circuit and producing in response thereto a first signal;
    (b) a first amplifier receiving the first signal and producing an amplified second signal;
    (c) a first impedance matching circuit connected to receive the second signal and match the second signal to a first impedance;
    (d) a double-mode resonator SAW bandpass filter with a bandwidth of approximately 30 kilohertz and having an input connected to receive the second signal and producing a filtered third signal;
    (e) a second impedance matching circuit connected to receive the third signal after it is filtered by the double-mode resonator SAW bandpass filter and impedance match it to a second input impedance;
    (f) a second amplifier receiving the third signal after it has been impedance matched, and producing in response thereto a fourth signal;
    (g) a second mixer circuit receiving the fourth signal and a second local oscillator signal, and producing an IF signal in response to the fourth signal and that second local oscillator signal;
    (h) a first IF filter connected to receive and filter the IF signal;
    (i) a third amplifier connected to receive and apply the IF signal to produce an amplified IF signal;
    (j) a detector circuit connected to produce an audio frequency output signal in response to the amplified IF signal.

2. The IF circuit of claim 1 wherein the third amplifier includes a limiter amplifier circuit and an input connected to receive the amplified IF signal to perform the function of limiting the amplified IF signal.

3. The IF circuit of claim 2 including a buffer circuit having an input coupled to receive the audio frequency output signal produced by the detector circuit to produce an amplified audio output signal.

4. The IF circuit of claim 3 including a second IF filter coupling an output of a first stage of the third amplifier to an input of the limiter amplifier.

5. The IF circuit of claim 4 wherein the first local oscillator signal has a frequency of 785.84 to 810.84 megahertz.

6. The IF circuit of claim 5 wherein the second local oscillator circuit produces a frequency of 82.705 megahertz.

7. The IF circuit of claim 6 wherein the input amplifier has a noise figure of approximately 2 db or lower.

8. The IF circuit of claim 7 wherein the noise figure of the double-mode resonator SAW bandpass filter is less than approximately 5 db.

9. A method of producing an amplified IF signal in a cellular telephone receiver, the method comprising the steps of:
    (a) applying an rf signal having a signal strength of $-116$ dbm to $-30$ dbm to an input amplifier;
    (b) applying an output signal produced by the first input amplifier and a first local oscillator signal to a first mixer circuit to produce a first signal;
    (c) applying the first signal to produce an amplified second signal;
    (d) impedance matching the second signal to a first impedance;
    (e) filtering the second signal with a double-mode resonator SAW bandpass filter to produce a filtered third signal, the double-mode resonator SAW bandpass filter having a bandwidth of approximately 30 kilohertz and an insertion loss of less than 5 db;
    (f) impedance matching the third signal to a second impedance after the third signal is filtered by the double-mode resonator SAW bandpass filter;
    (g) amplifying the third signal after it has been impedance matched to produce a fourth signal;
    (h) applying the fourth signal and a second local oscillator signal to a second mixer circuit to produce an IF signal;
    (i) filtering the IF signal by means of a first IF filter connected to receive and filter the IF signal;
    (j) amplifying the IF signal to produce the amplified IF signal, and whereby the amplified IF signal can be applied to a quadrature detector circuit to produce an audio frequency output signal.

* * * * *